United States Patent

Kamae et al.

[11] Patent Number: 6,000,047
[45] Date of Patent: Dec. 7, 1999

[54] SCANNING MEMORY DEVICE AND ERROR CORRECTION METHOD

[75] Inventors: Takahiko Kamae; Mitsuchika Saito, both of Kawasaki; Kiyoyuki Ihara, Yokohama, all of Japan

[73] Assignee: Hewlett-Packard Company, Palo Alto, Calif.

[21] Appl. No.: 09/023,665

[22] Filed: Feb. 10, 1998

Related U.S. Application Data

[62] Division of application No. 08/569,440, Dec. 8, 1995, Pat. No. 5,848,077.

[51] Int. Cl.⁶ .................................................. G06F 11/00
[52] U.S. Cl. ........................ 714/710; 714/711; 714/718; 360/31; 360/53
[58] Field of Search ................................ 371/21.1, 22.1, 371/10.2; 360/31, 53; 714/718, 724, 711, 710

[56] References Cited

U.S. PATENT DOCUMENTS

| | | | |
|---|---|---|---|
| 4,405,952 | 9/1983 | Slakmon | 360/49 |
| 4,571,716 | 2/1986 | Szerlip | 369/54 |
| 4,841,498 | 6/1989 | Tatuo et al. | 369/32 |
| 5,036,490 | 7/1991 | Kajimura et al. | 365/151 |
| 5,164,577 | 11/1992 | Horie | 235/494 |
| 5,216,631 | 6/1993 | Sliwa, Jr. | 365/174 |

FOREIGN PATENT DOCUMENTS

| | | | |
|---|---|---|---|
| 0 381 113 A2 | 8/1990 | European Pat. Off. | G11B 9/00 |
| 0 382 192 A1 | 8/1990 | European Pat. Off. | G11B 9/10 |
| 0 517 074 A2 | 12/1992 | European Pat. Off. | G11B 9/00 |
| 0 518 283 A2 | 12/1992 | European Pat. Off. | G11B 9/00 |
| 0 522 168 A1 | 1/1993 | European Pat. Off. | H01J 37/30 |
| WO 88/02918 | 4/1988 | WIPO | G11B 27/19 |

OTHER PUBLICATIONS

Chen, Peter M. et al., "RAID: High Performance, Reliable Secondary Storage", ACM Computing Surveys, vol. 26, No. 2, Jun. 1994, pp. 145–185.

*Primary Examiner*—Phung M. Chung

[57] ABSTRACT

A high-data density, high-data rate scanning memory device reads and writes data using a plurality of probes. The scanning memory device comprises a memory composed of a matrix of cell arrays each containing a submatrix of memory cells, a plurality of probes having a one-to-one correspondence to each cell array, and a positioning device that operates to simultaneously change the positions of probes relative to the cell arrays. Each of the cell arrays has a cell array status memory for storing information designating whether the cell array is functional or whether the cell array is defective. If the number of defective memory cells detected within each cell array exceeds some predetermined number, the cell array is designated as defective. Defective cell arrays are logically replaced by functional cell arrays. Error correction is applied to the data to reduce reading and writing errors by the scanning memory device and to maintain the integrity of data stored in the memory.

3 Claims, 8 Drawing Sheets

SCANNING MEMORY DEVICE AND ERROR CORRECTION METHOD

This application is a division of Ser. No. 08/569,440 filed on Dec. 8, 1995 which is now as U.S. Pat. No. 5,848,077.

FIELD OF THE INVENTION

The present invention discloses a scanning memory device for reading and writing data using a plurality of miniature probes. The present invention also discloses an error correction method used to correct errors in the reading and writing of data and errors caused by defects in memory cells of the scanning memory device.

BACKGROUND OF THE INVENTION

Rotating media memory devices, such as hard disk drives (HDDs) or optical disk drives (ODDs), have high data density and high speed data storage and retrieval. However, rotating media memory devices may be inadequate to meet increased data density needs of the future. For example, while the physical limit of the data density in a HDD is about 100 Gigabits (Gbits)/cm$^2$, reliable reading and writing of data is presently constrained to data densities of approximately 10 Gbits/cm$^2$. The physical limit of data density of an ODD is constrained by the wavelength of light used and is presently less than 1 Gbits/cm$^2$.

Scanning memory devices proposed by Suriwa (Japanese Patent Laid-Open No. 4-289580 and U.S. Pat. No. 5,216,631) and by Saito et al. (Japanese Patent Application No. 6-270297) use the principle underlying a scanning probe microscope to read and write data to achieve data densities and data transfer rates exceeding those of HDDs and ODDs. Unfortunately, as data density and data transfer rates increase, there is a corresponding increase in errors caused by defects in storage media and in errors in data reading and writing.

SUMMARY OF THE INVENTION

In the preferred embodiment of the present invention a scanning memory device (hereinafter, a memory device) has high data transfer rates and is robust with respect to defects in the storage media and to errors in data reading and writing. The memory device has multiple cell arrays at fixed positions relative to each other, and multiple probes which have a one-to-one correspondence with each one of the cell arrays. The probes and the cell arrays each form a two-dimensional matrix of N rows by M columns. The values of N and M are usually several tens to several hundreds. A positioning device simultaneously changes the position of all the probes relative to the cell arrays. The storage media comprises individual memory cells, or cells, within each cell array which form an n-row by m-column two-dimensional submatrix. One probe accesses the cells within each corresponding cell array and the cell density in the submatrix is determined by the positional resolution of the probes. Typical values of n and m are several hundreds to several thousands. The probes operate in parallel to achieve high data transfer rates.

Each cell array has a functional status memory for storing a status indicator, indicating whether the cell array is functional or defective. If the number of defective cells detected within a cell array is determined to be excessive, that cell array is designated as defective, and data reads and writes are no longer performed in that cell array. The functional status indicator stored in each cell array is distributed throughout the memory, providing the scanning memory device with high tolerance to defective cells. Defective cell arrays are circumvented by the probes during data reading and writing. The scanning memory device routes data around defective cell arrays in short time periods, relative to the typical read and write cycles.

Error correcting codes are also included in the data. One error correcting code is used when reading and writing data. A second error correcting code maintains the integrity of the stored data by monitoring error generation rates by the memory cells. Time intervals between normal reading and writing operations can be used to detect errors and route data around defective memory cells. Thus, in the scanning memory device, high data transfer rates and low error rates are simultaneously achieved.

DETAILED DESCRIPTION OF THE PREFERRED EMBODIMENT

Figure 1:
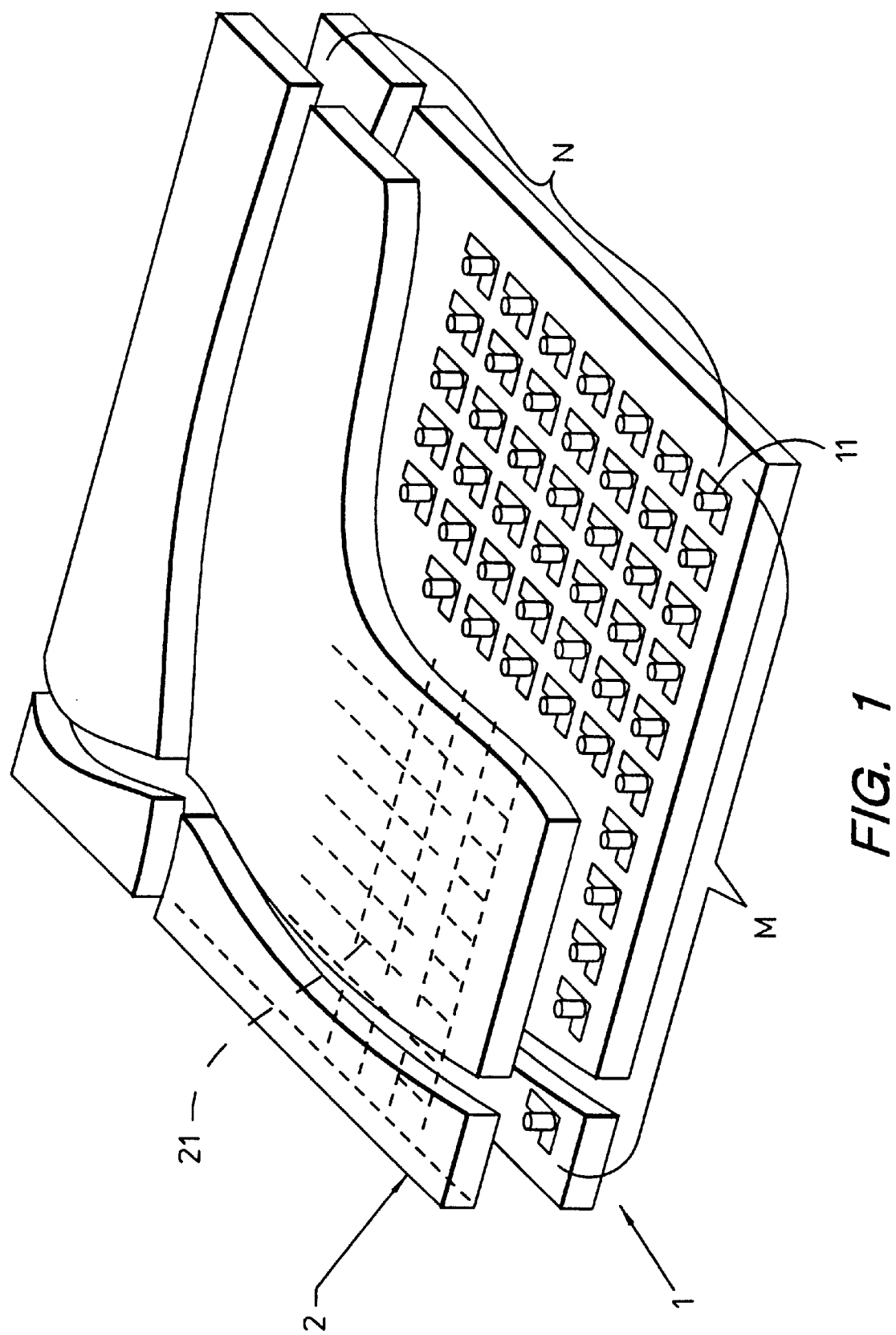
FIG. 1 shows a scanning memory device of the present invention.

FIG. 1 shows a scanning memory device constructed in accordance to the preferred embodiment of the present invention. A plurality of probes 11 are mounted on a probe base 1 at fixed positions relative to each other and multiple cell arrays 21 at fixed positions relative to each other form memory 2. Each cell array 21 corresponds to one probe 11. The plurality of probes 11 may be moved simultaneously by moving the probe base 1. The probes 11 are arranged in a two-dimensional matrix having N rows and M columns. The cell arrays 21 are also arranged in a two-dimensional matrix, N rows by M columns, corresponding to the matrix of the probes 11. Within each cell array 21 are memory cells, or cells (not shown in FIG. 1), formed in an n-row by m-column, two-dimensional submatrix. In this embodiment, N=M=100 and n=m=1024. This produces a storage capacity for each cell array 21 of about one Megabit (1024×1024), and the aggregate of cell arrays forms a memory 2 having about 10 Gigabits (100×100×1024×1024) of data storage.

A variety of actuator mechanisms, such as electrostatic actuator types, bimorph types, or piezoelectric types may be used to move the memory 2 relative to the probes 11. The relative movement is a scanning motion between the plurality of probes 11 and memory 2 in the lateral direction. A typical scanning speed of the probes 11 relative to memory 2, is 3 mm/sec. For a cell size of 30 nm, the data density is 100 Gbits/cm$^2$ and the data transfer rate between the probes 11 and memory 2 is 100 kilobits/second (kbps). This data transfer rate is readily increased by parallel operation of probes 11. For example, if the M probes 11 within a row, called a probe group, are connected to a data transfer line, the data transfer rate from the data transfer line can produce a serial data stream at 100×100 kbps, or 10 Megabits/sec (Mbps). Parallel operation of additional data transfer lines enables the data transfer rate to be further increased.

Figure 2:
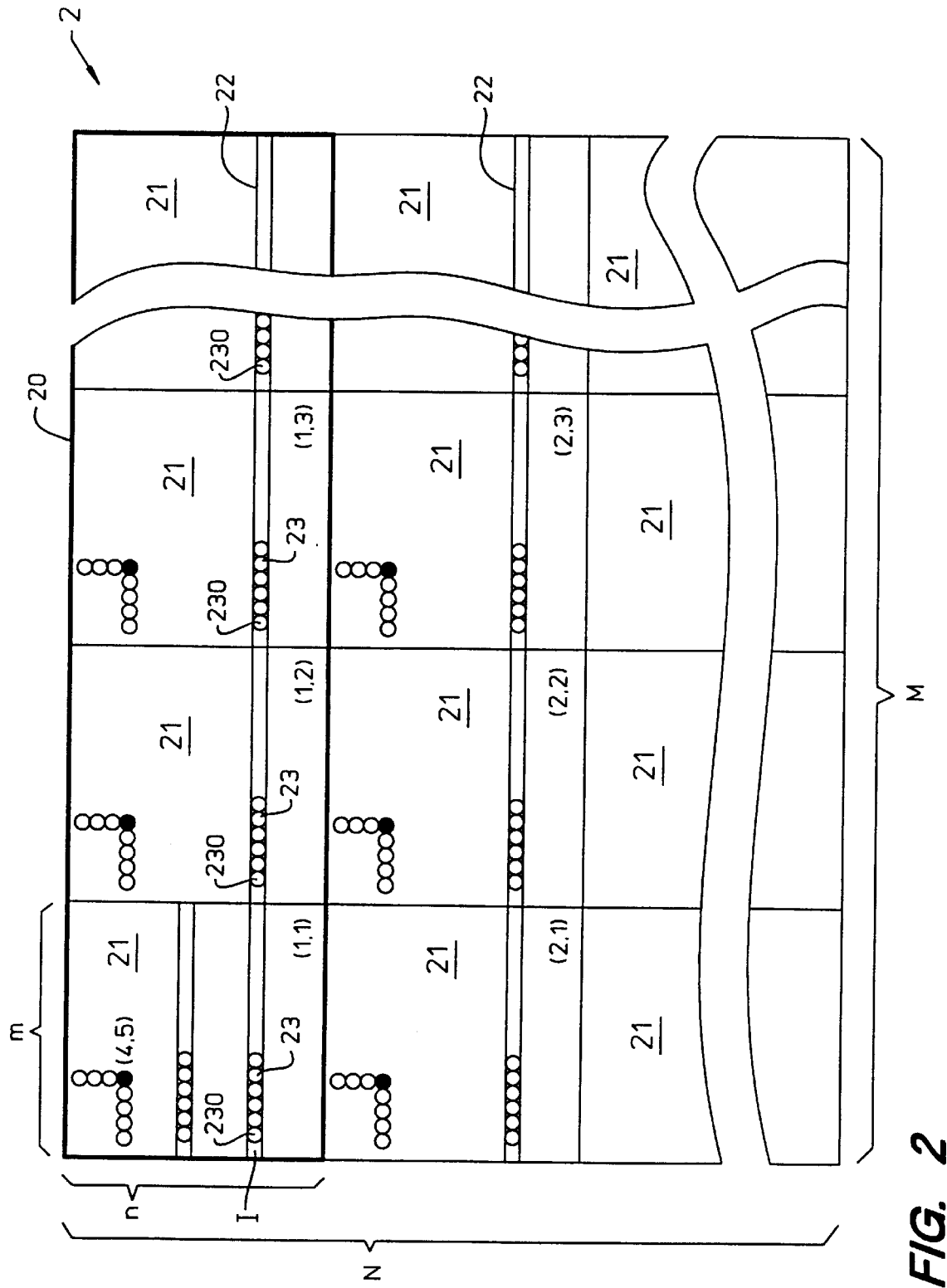
FIG. 2 shows an enlarged view of a memory of the scanning memory device of FIG. 1.

FIG. 2 shows an enlarged view of the memory 2. Each cell array 21 of memory 2 is represented by a cell array, row position and a cell array, column position, indicated in parentheses (as cell array row position, cell array column position). An example of cell arrays 21 in the same row is outlined by a bold line and forms a cell array row 20. The position of memory cells, or cells (indicated by circles), within the cell arrays 21 is represented by a cell row position and a cell column position. For example, corresponding cell positions (4,5) in each cell array 21 are indicated by the black dots in the cell arrays. Further, a set of cells in the same row within each cell array row 20 form a cell row 22. Two cell rows 22 are shown. A specific cell row 22 can be identified by its row number, I. A cell block 23 is composed of cells in a common cell row 22 and common cell column. Cell blocks 23 provide the cells at which each probe within a probe group is simultaneously positioned for reading and writing data.

Figure 3:
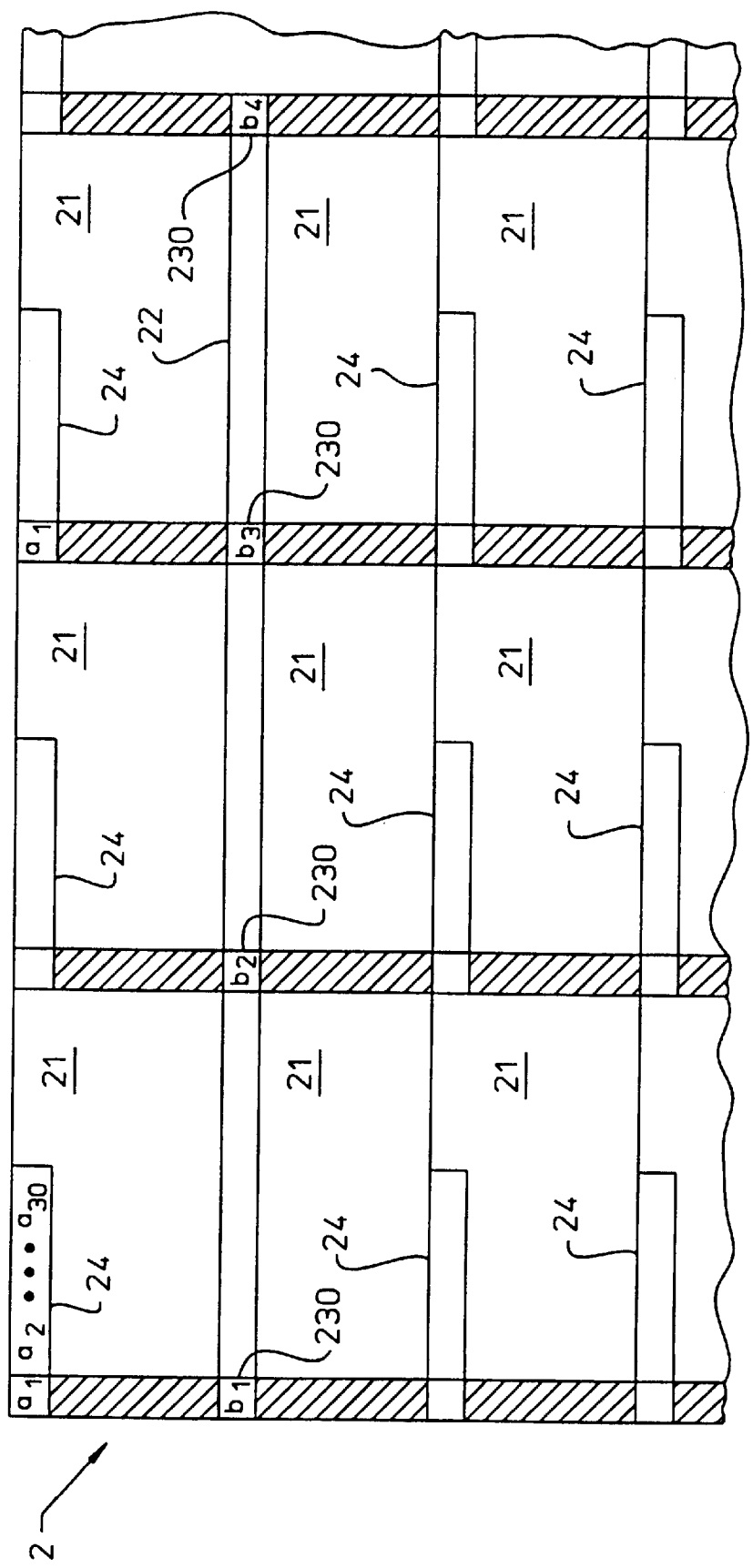
FIG. 3 shows a detailed view of cell arrays within the memory of the present invention.

FIG. 3 shows a detailed view of cell arrays 21 within memory 2. In a first initialization of memory 2, data is written to and read from all of the cells in each of the cell arrays 21 to check the functionality of the cells. A status indicator for each cell array 21 designates each cell array 21 as either functional or defective, based on the number of errors in the data reading and writing. For example, if at least 100 cells within a given cell array 21 are defective, the functional status of the cell array 21 is defective. The status indicator for each cell array 21 is stored in a status memory 24 within each cell array 21. Although the status indicator corresponds to one bit of information, and since defective cells may also exist in the status memory 24, to reduce the probability of an error, the status indicator is represented using a greater number of bits, for example, 30 bits, $a_1$, $a_2$, ... $a_{30}$, as shown in FIG. 3. The cell array 21's status memory 24 can be distributed within the cell array 21, but preferably it is located at the top of each cell array 21, shown by $a_1, a_2, \ldots, a_{30}$, for efficiency in writing and reading the status indicator.

In a second initialization of memory 2, a decision of functional or defective status is made for each cell row 22, based on the number of defective cells within the cell row 22. The number of defective cells in each cell row 22 is also determined by writing data to and reading data from cells within a cell row 22 and a row status indicator based on the number of defective cells in the cell row 22 is stored in a portion of the first cell block 230 in the cell row 22. The row status indicator for each cell row 22 is also represented by more than one bit, $b_1, b_2, b_3, \ldots$, to reduce the probability of errors.

Figure 4:
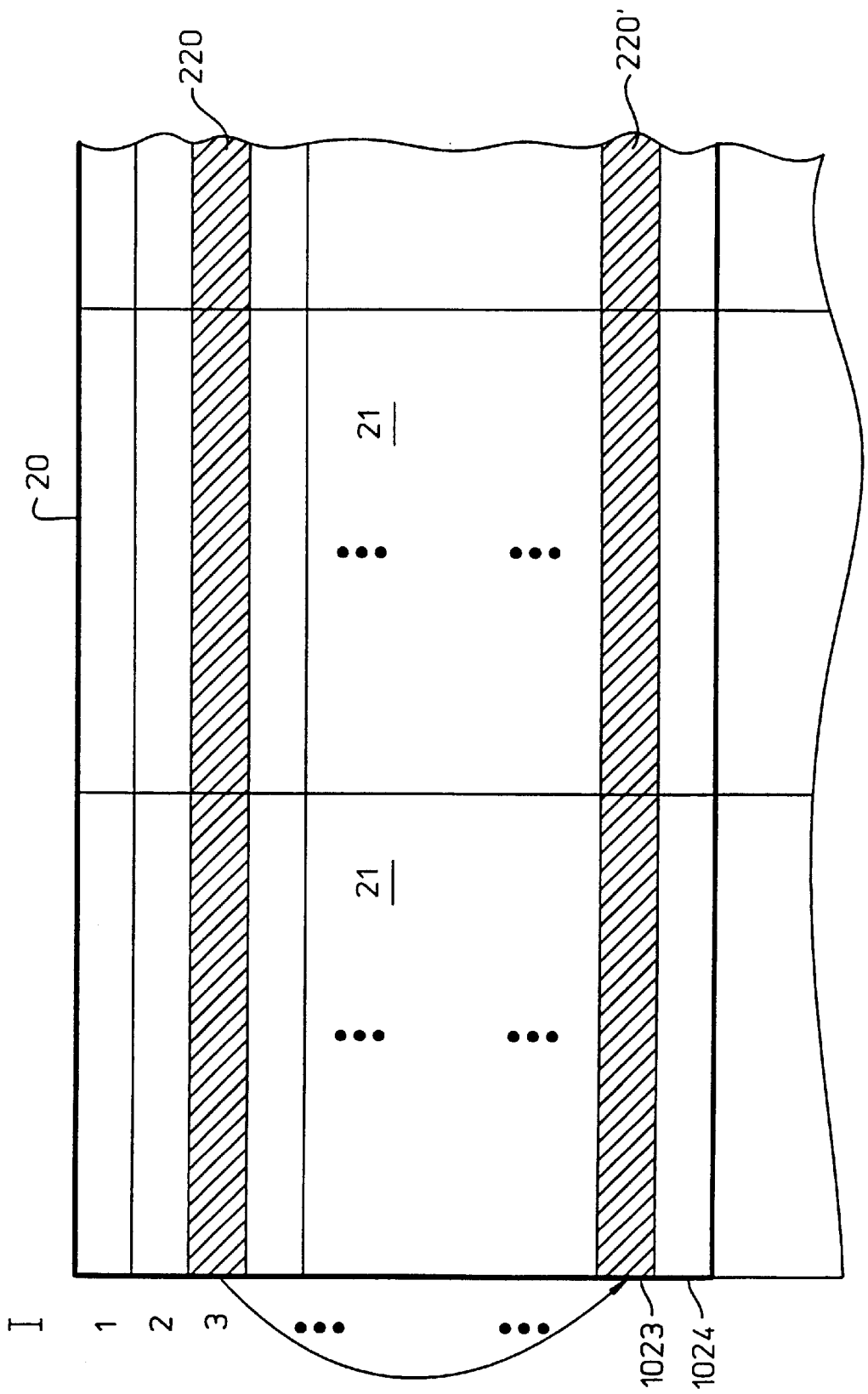
FIG. 4 shows the physical locations of a defective cell row and a functional replacement cell row of the present invention.

FIG. 4 shows the physical positions of a defective cell row 220 in row 3 and a functional replacement cell row 220' stored as a spare in row 1023 within a cell array row 20. The final stage of the initialization process involves storing the row number I of the replacement cell row 220'. If a cell row 22 has been determined to be defective, the defective cell row 220 is logically replaced by a functional cell row 220' (shown by the arrow). The cell row number I (in this example I=1023), of the replacement cell row 220' is also stored in a portion of the first cell block 230, of the cell row 220 that is being replaced. In this embodiment, the row number I varies from 1 to 1,024 and is represented by 10 bits. Thus, the row status indicator and the row number I of the replacement row are both stored in the first cell block 230 within each cell row 22. Since each cell block 23 has a bit length equal to M, the number of columns of cell arrays 21, (100 bits in this embodiment), even if one or more defective cells are present in the first cell block 230, the row status indicator and the row number I can be stored in the first cell block 230 using a sufficiently large number of bits to yield an acceptably low probability of error.

Figure 5:
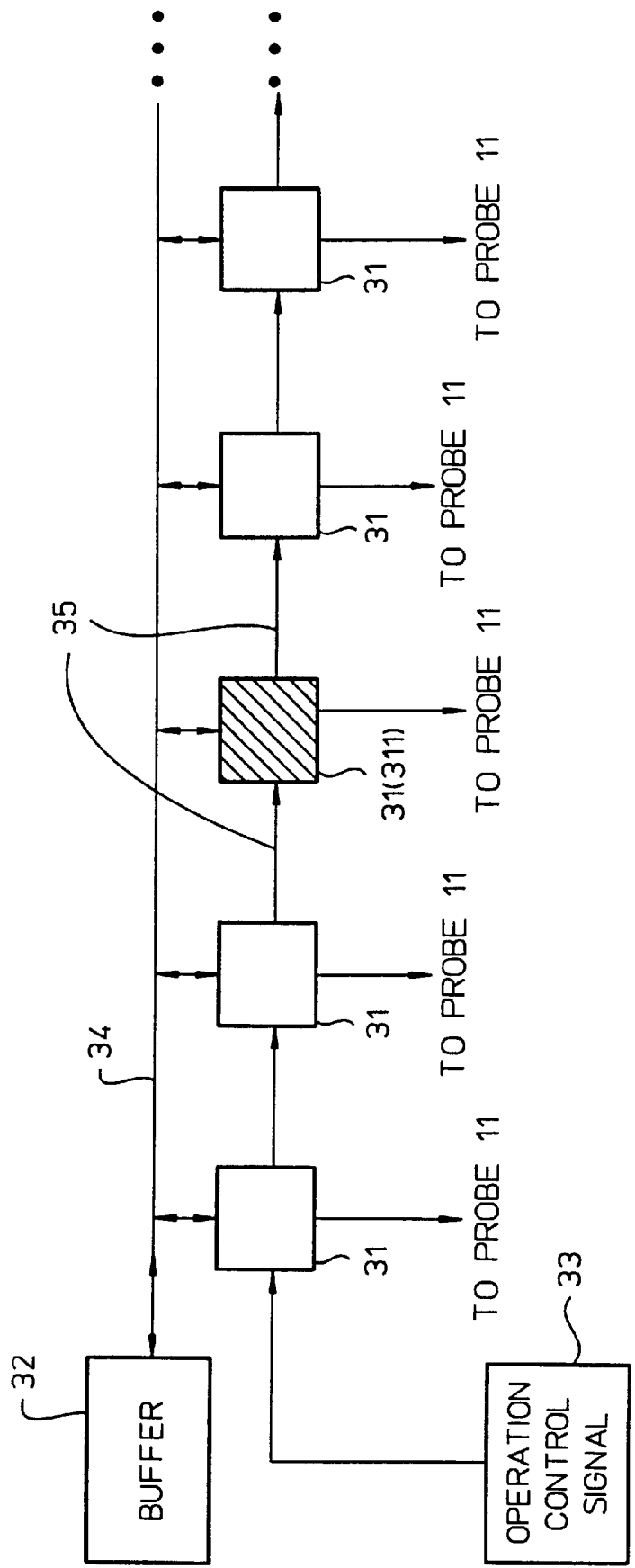
FIG. 5 is a schematic illustrating data redirection around a defective cell array of the present invention.

FIG. 5 is a schematic illustrating data redirection around a defective cell array 21 after the first initialization of memory 2. A bidirectional data transfer line 34 is shown connecting to a buffer 32. One data transfer line 34 is established for each probe group and corresponds to each cell array row 20. Multiple one bit buffers 31, each one bit buffer 31 corresponding to a probe 11, are connected to the data transfer line 34. Since each one bit buffer 31 corresponds to a probe 11, the one bit buffers 31 are also represented by a N-row×M-column matrix (only a portion of one row is shown in FIG. 5). The data transfer line 34 is enabled by an operation control signal 33 which occurs when probe 11's are positioned at a cell column number which is less than the total number of cell columns m.

Upon power-up of the scanning memory device, the functional status indicators for all of the cell arrays 21 stored in the status memories 24, are read. These status indicators for each cell array 21 are then loaded into the one-bit buffers 31 for each probe 11 corresponding to each cell array 21. Once in the one bit buffers 31, the status indicators are used to route data around defective cell arrays 21. Data is transferred cell block 23 by cell block 23 within each cell row 22. As an illustration, suppose a probe 11 is positioned at a cell block 23 of a cell row 22 (see FIG. 2).

If the status indicator stored in a one bit buffers 31 indicates a functional cell array 21, transfer of data between the buffer 32 and memory cells occurs, and an end-of-operation signal 35 is output to the next one bit buffer 31, indicated by the direction of the arrows between one bit buffers 31. If the status indicator stored in a one bit buffer 31 indicates a defective cell array 21, upon receiving an end-of-operation signal, the one bit buffer corresponding to a defective cell array, shown as 311, immediately outputs an end-of-operation signal 35 without transferring its data between memory 2 and buffer 32. Hence, the bidirectional transfer of data between the buffer 32 and a cell array 21 is dependent upon the functional status indicator that had been loaded into the one bit buffer 31. Data routed around a defective cell array 21 is sent to the next functional cell array 21 in the cell array row 20. Thus, defective cell arrays 21 are bypassed and logically replaced by functional cell arrays 21. The data from cell arrays 21 of memory 2 is transferred to and from external circuits (not shown) through the buffer 32 and is input or output sequentially in time using, for instance, phase shift keying (PSK).

Figure 6:
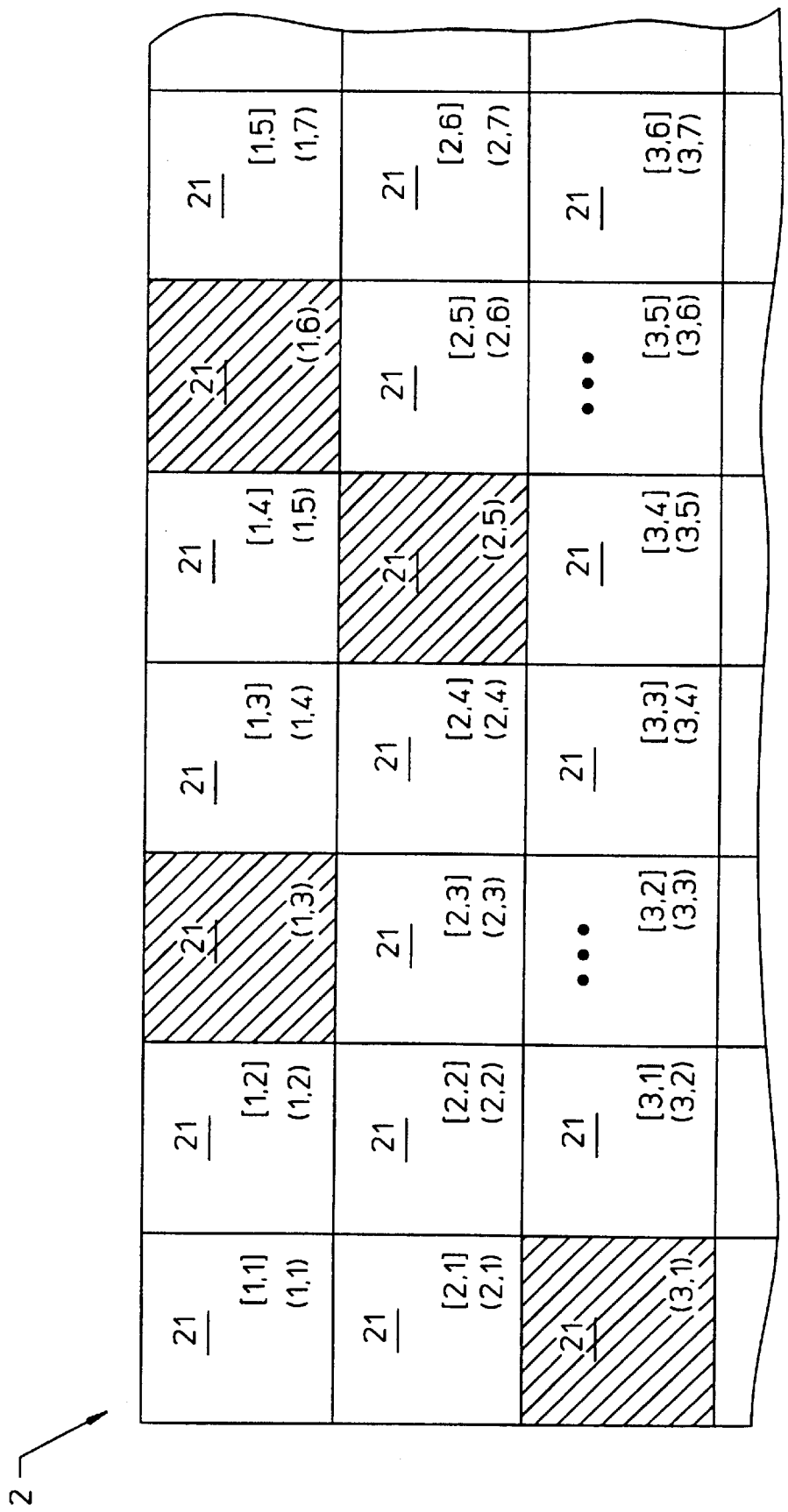
FIG. 6 shows a portion of memory including logical replacement of defective cell arrays of the present invention.

FIG. 6 shows a portion of memory 2 after logical replacement of defective cell arrays 21 based on the first initialization of the memory. Hatching indicates a defective cell array 21. The parentheses represent the physical location of the cell array 21's row number and column number while the brackets represent the logical position of the cell array 21 as the result of logical replacement of defective cell arrays by functional cell arrays.

Based on the second initialization of the memory 2, defective cell rows 220 are logically replaced by spare, functional cell rows 220'. This process is explained with reference to FIGS. 2 through 4. Probe groups, each comprised of probes 11 within a given row are placed in correspondence to the first cell block 230 within a cell row 22, indicated by $b_1$, $b_2$, . . . of FIG. 3. As previously described, the row status indicator for the cell row 22, has been written in the first cell block 230 during the second initialization of memory 2. If the row status indicator indicates a functional cell row 22, then data is read from cell blocks 23 by the probe group. If the row status indicator indicates a defective cell row 22, the row number I of the cell row 22 that replaces the defective cell row has also been stored in a portion of the first cell block 230 and these are read by the probes 11 in the probe group. The probe group then reads and writes data to the cell row 22 having the replacement row number I.

Unfortunately, as memory 2 achieves higher cell density, defects in the cells occur more frequently. As a result, error correction is usually implemented to compensate for the defective cells. In this embodiment, data is transferred in multiple units of 100 kilobits (kbits) and two error correcting codes are appended to the data. One error correcting code is to verify data reading and writing. The other error correcting code maintains the data integrity by verifying the functionality of the memory cells.

Figure 7:
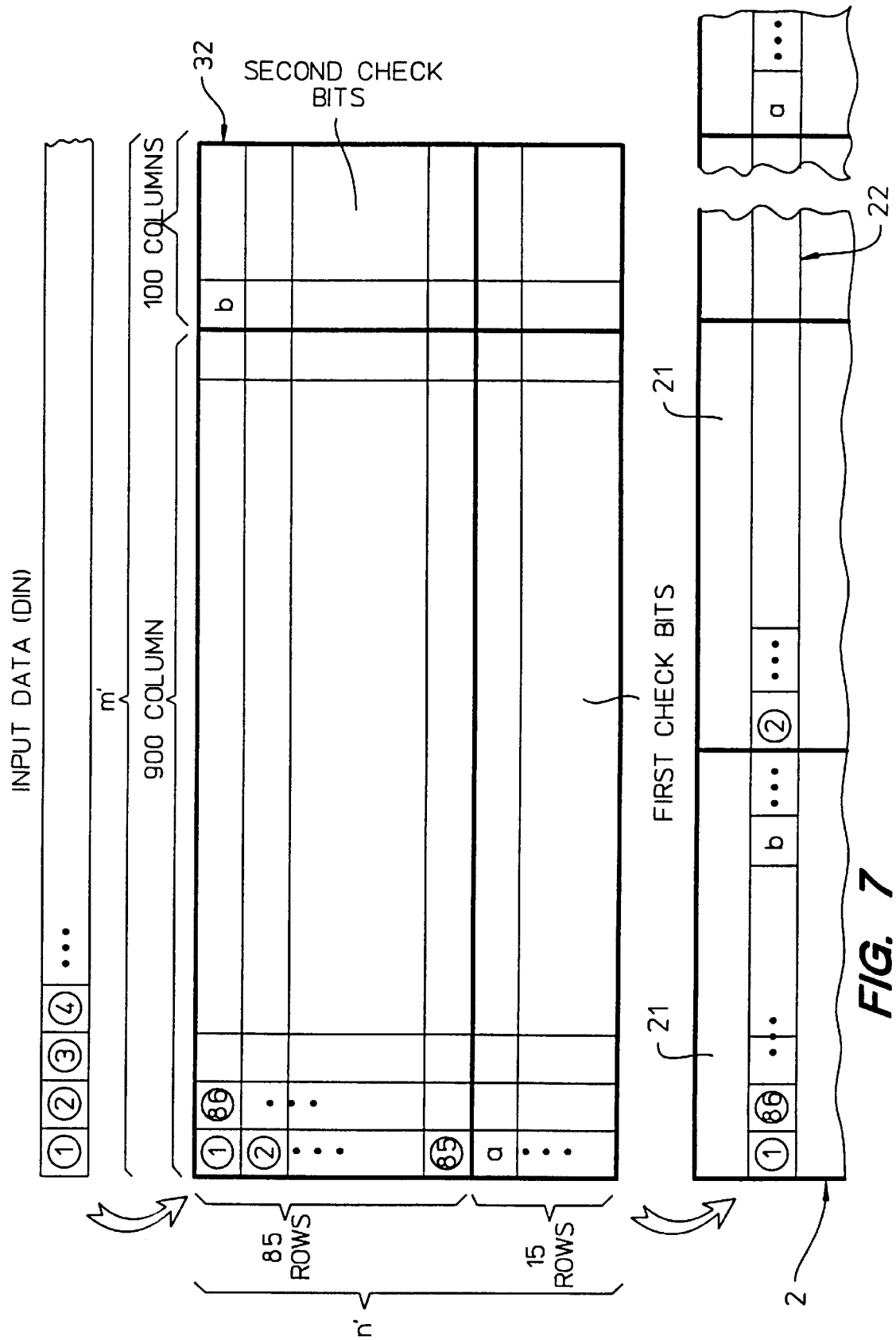
FIG. 7 shows an arrangement of data and check bits in a buffer of the present invention.

FIG. 7 shows an arrangement of data in buffer 32, including first check bits and second check bits, in the present invention. Buffer 32 has storage capacity of 100 kbits, and data which is read to and from memory 2 is stored temporarily in the buffer 32 in an n'-row×m'-column matrix (for simplicity, n'=100, m'=1000). Fifteen rows of the buffer 32 are used for first check bits and 100 columns of the buffer are used for second check bits. The data actually occupies 76,500 bits, 85 rows×900 columns. The first check bits, generated by error correction coding in the column direction (15-row×900-bit area) are appended, and the second check bits, generated similarly by error correction coding in the row direction (85-row×100-bit area) are also appended. Additionally, a product code (not shown) of the first and second check bits may be appended if necessary. The data, the first check bits and the second check bits are written to the cell array 21 from buffer 32 in the order shown in FIG. 7, that is, each row of buffer 32 is transferred to a portion of each cell row 22, such that the 100 rows in the buffer 32 occupy a single cell row 22 in memory 2.

In contrast to writing data from buffer 32 to memory 2, data is read from memory 2 and transferred to buffer 32 in units of cell blocks 23 (100 bits in this embodiment). During normal operation, data from one cell block 23 is read into each of the m' columns of buffer 32. Because errors may accumulate due to noise or other factors when data is written to, or from, memory 2, before data is output from buffer 32, error correction is performed using the first check bits.

The second check bits maintain the integrity of stored data by verifying the functionality of cells. Data is read in units of cell rows 22 from memory 2 to the columns of the buffer 32 and is rewritten into memory 2 after error correction is performed on the data using the second check bits. Reading data to the buffer 32 and rewriting the data to the memory 2, called error clearing, is performed in time intervals between data read and write operations by the probes 11. Use of error clearing is determined by examining error generation rates during error correction by the first check bits. For example, when the number of errors generated by one cell block 23 exceeds a predetermined number, error clearing is applied.

Figure 8:
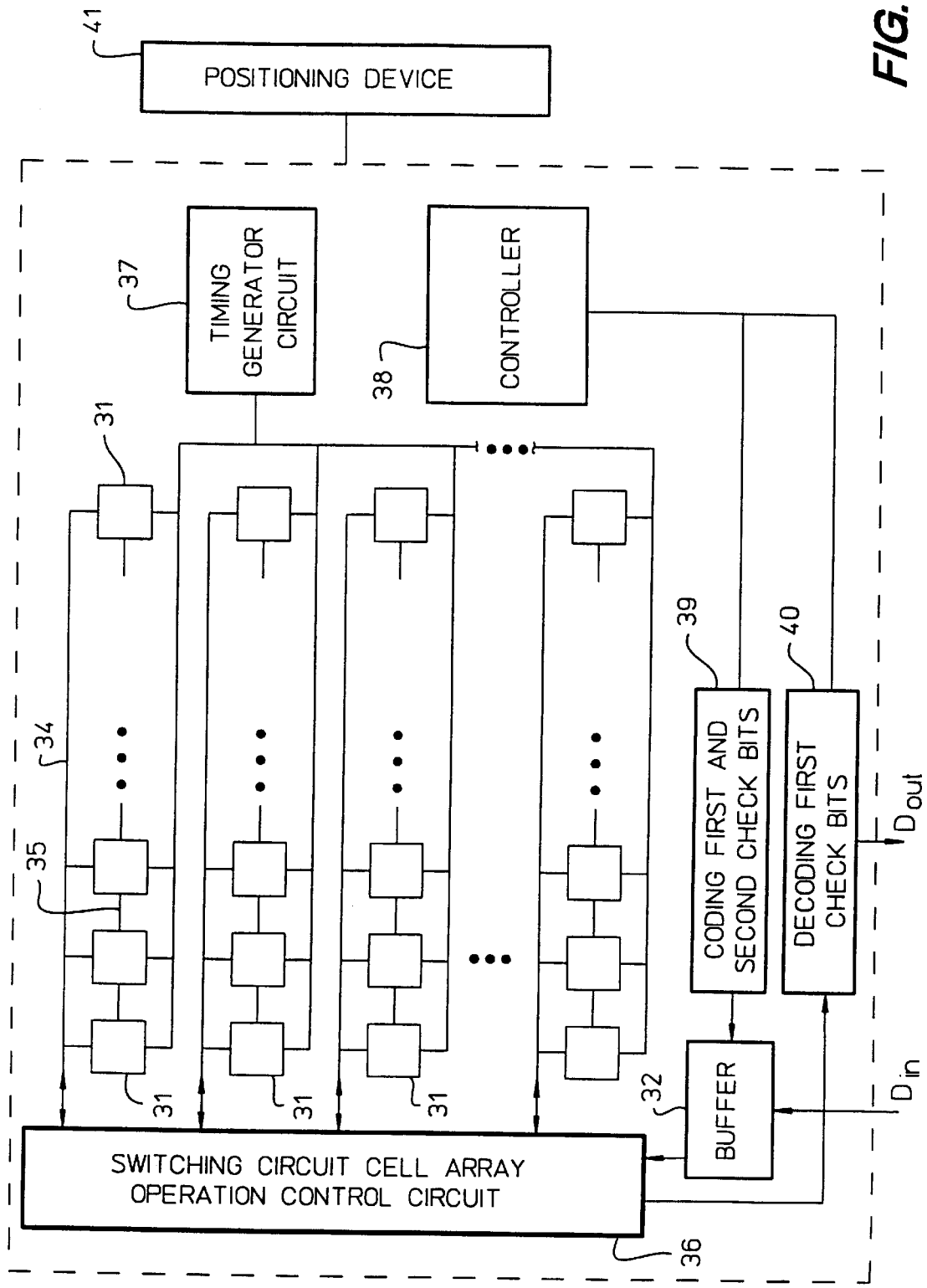
FIG. 8 is a schematic drawing of the scanning memory device of the present invention.

FIG. 8 is a schematic drawing of the scanning memory device (not including memory 2). The number of one bit buffers 31 equals the number of cell arrays 21. The data transfer lines 34 connect to control circuit 36 and also connect to the one bit buffers 31 corresponding to each cell array row 20. Thus, the number of transfer data lines 34 equals the number N of cell array rows 20 in memory 2. Each one bit buffer 31 receives a read/write (r/w) signal from the timing generator circuit 37.

Positioning device 41 controls the lateral position of the probes 11 relative to the cell arrays 21. During data input, the input data Din is stored temporarily in buffer 32. The first and second check bits are coded by coding circuit 39 and are also stored in buffer 32. The data Din and the first and second check bits are written to the control circuit 36, through the data transfer lines 34, to the one bit buffers 31 and then, to cells within the cell arrays 21. During data output, the data written from the cells of cell arrays 21 passes through circuit 36 via the data transfer lines 34, and to a first decoder 40 to decode the first check bits. The final output data Dout is then presented at the output of first decoder 40.

The first decoder 40 has, for example, error correction capability of 5 bits. The coding circuit 39, coding the first and second check bits, has error correction capability of, for example, 10 to 15 bits. The number of bits of error correction is determined by the functional integrity of the memory cells, the permissible error rate induced in the data and the time allotted for error correction. Error generation rate during error clearing is monitored by a controller 38 and based on the error generation rate, defective cell rows 22 and defective cell arrays 21 may be logically replaced by functional cell rows 22 and cell arrays 21. Logical replacement can be implemented during initialization of memory 2 and in time intervals between normal data reading and writing operations. For example, a cell array 21 or cell array row 22 can be logically replaced as part of normal operation of the scanning memory device 2.

We claim:

1. A scanning memory device for storing and retrieving data from external circuits, comprising:

a memory including an array of memory cells organized into row units and column units, each row unit including a plurality of memory cells and a status indicator for indicating if that row unit is defective;

multiple probes, organized into row groups;

a positioning device for positioning the memory relative to the probes, the row groups of probes operative to read data from the row units of memory and to write data to the row units of memory as the relative position of the memory with respect to the probes is changed; and multiple data transfer lines, each data transfer line assigned to a different one of the row groups and operative to provide bi-directional transfer of data between the row units and the external circuits.

2. The scanning memory device of claim 1 wherein a row unit of the memory is designated as defective when at least a predetermined number of memory cells within that row unit are defective.

3. The scanning memory device of claim 2 wherein each of the row units designated as defective is replaced by a corresponding row unit not designated as defective.

* * * * *